(12) United States Patent
Tabatabaei

(10) Patent No.: US 7,616,036 B1
(45) Date of Patent: Nov. 10, 2009

(54) PROGRAMMABLE STROBE AND CLOCK GENERATOR

(75) Inventor: Sassan Tabatabaei, Sunnyvale, CA (US)

(73) Assignee: Virage Logic Corporation, Fremont, CA (US)

( * ) Notice: Subject to any disclaimer, the term of this patent is extended or adjusted under 35 U.S.C. 154(b) by 150 days.

(21) Appl. No.: 11/340,147

(22) Filed: Jan. 25, 2006

Related U.S. Application Data

(60) Provisional application No. 60/716,386, filed on Sep. 12, 2005.

(51) Int. Cl.
 *H03L 7/06* (2006.01)
(52) U.S. Cl. ........................... 327/158; 327/149
(58) Field of Classification Search .............. None
 See application file for complete search history.

(56) References Cited

U.S. PATENT DOCUMENTS

| | | | |
|---|---|---|---|
| 5,062,122 A | 10/1991 | Pham et al. | |
| 5,101,153 A | 3/1992 | Morong, III | |
| 5,670,890 A | 9/1997 | Colwell et al. | |
| 5,915,105 A | 6/1999 | Farmwald et al. | |
| 5,923,676 A | 7/1999 | Sunter et al. | |
| 5,954,804 A | 9/1999 | Farmwald et al. | |
| 5,995,443 A | 11/1999 | Farmwald et al. | |
| 6,011,732 A | 1/2000 | Harrison et al. | |
| 6,032,214 A | 2/2000 | Farmwald et al. | |
| 6,035,365 A | 3/2000 | Farmwald et al. | |
| 6,044,426 A | 3/2000 | Farmwald et al. | |
| 6,049,846 A | 4/2000 | Farmwald et al. | |
| 6,058,496 A | 5/2000 | Gillis et al. | |
| 6,085,284 A | 7/2000 | Farmwald et al. | |
| 6,100,735 A * | 8/2000 | Lu | 327/158 |
| 6,101,152 A | 8/2000 | Farmwald et al. | |
| 6,107,826 A | 8/2000 | Young et al. | |
| 6,166,563 A | 12/2000 | Volk et al. | |
| 6,173,432 B1 | 1/2001 | Harrison | |
| 6,260,163 B1 | 7/2001 | LaCroix et al. | |
| 6,260,263 B1 | 7/2001 | Haase | |
| 6,262,585 B1 | 7/2001 | Frodsham et al. | |
| 6,348,811 B1 | 2/2002 | Haycock et al. | |
| 6,348,826 B1 | 2/2002 | Mooney et al. | |
| 6,397,361 B1 | 5/2002 | Saitoh | |
| 6,405,335 B1 | 6/2002 | Whetsel | |
| 6,421,801 B1 | 7/2002 | Maddux et al. | |
| 6,425,097 B1 | 7/2002 | Elachkar et al. | |
| 6,429,715 B1 | 8/2002 | Bapat et al. | |
| 6,445,231 B1 * | 9/2002 | Baker et al. | 327/158 |
| 6,449,738 B1 | 9/2002 | Hinedi et al. | |
| 6,452,432 B2 | 9/2002 | Kim | |

(Continued)

OTHER PUBLICATIONS

Adham, Saman, et al., "Preliminary Outline of the IEEE P1500 Scaleable Architecture for Testing Embedded Cores," IEEE P1500 Architecture Task Force, 1999, 6 pages.

(Continued)

*Primary Examiner*—Cassandra Cox
(74) *Attorney, Agent, or Firm*—Rutan & Tucker LLP

(57) ABSTRACT

Timing test circuits, including programmable strobe and clock generators, may include at least two DLLs having differing numbers of delay elements thereby producing many timing signals having various phase relationships. A detector circuit can generate many different timing intervals as may be defined by independently selected events in signals arising from both of the DLLs.

21 Claims, 11 Drawing Sheets

U.S. PATENT DOCUMENTS

| | | | |
|---|---|---|---|
| 6,476,652 B1 | 11/2002 | Lee et al. | |
| 6,477,674 B1 | 11/2002 | Bates et al. | |
| 6,483,360 B2 | 11/2002 | Nakamura | |
| 6,486,919 B1 | 11/2002 | Kim | |
| 6,492,798 B2 | 12/2002 | Sunter | |
| 6,492,851 B2 | 12/2002 | Watarai | |
| 6,502,050 B1 | 12/2002 | Chan | |
| 6,556,934 B2 | 4/2003 | Higashide | |
| 6,580,304 B1 | 6/2003 | Rieven | |
| 6,586,921 B1 | 7/2003 | Sunter | |
| 6,629,274 B1 | 9/2003 | Tripp et al. | |
| 6,639,426 B2 | 10/2003 | Haycock et al. | |
| 6,657,936 B2 * | 12/2003 | Harvey et al. | 369/59.12 |
| 6,671,847 B1 | 12/2003 | Chao et al. | |
| 6,675,364 B1 | 1/2004 | Basto et al. | |
| 6,691,269 B2 | 2/2004 | Sunter | |
| 6,694,441 B1 | 2/2004 | Sethia | |
| 6,694,464 B1 | 2/2004 | Quayle et al. | |
| 6,711,718 B2 * | 3/2004 | Pfeil et al. | 716/1 |
| 6,731,128 B2 | 5/2004 | Das et al. | |
| 6,750,688 B2 | 6/2004 | Takai | |
| 6,754,613 B2 | 6/2004 | Tabatabaei et al. | |
| 6,760,873 B1 | 7/2004 | Hao et al. | |
| 6,760,899 B1 * | 7/2004 | Young et al. | 716/16 |
| 6,774,694 B1 | 8/2004 | Stern et al. | |
| 6,777,995 B1 | 8/2004 | Harrison | |
| 6,823,500 B1 * | 11/2004 | Ganesh et al. | 716/9 |
| 6,823,502 B2 | 11/2004 | Wingren et al. | |
| 6,832,361 B2 * | 12/2004 | Cohn et al. | 716/6 |
| 6,839,860 B2 | 1/2005 | Lin | |
| 6,857,080 B1 | 2/2005 | Liang | |
| 6,865,135 B2 | 3/2005 | Choi | |
| 6,900,679 B2 | 5/2005 | Watarai | |
| 6,914,852 B2 | 7/2005 | Choi | |
| 6,934,215 B2 * | 8/2005 | Chung et al. | 365/233 |
| 7,010,074 B2 * | 3/2006 | Nakamura | 375/371 |
| 7,032,145 B1 | 4/2006 | Burlison | |
| 7,161,397 B2 * | 1/2007 | Lee et al. | 327/149 |
| 7,162,404 B2 | 1/2007 | Hunt et al. | |
| 7,181,704 B1 * | 2/2007 | Downs et al. | 716/3 |
| 7,199,625 B1 * | 4/2007 | Chung | 327/149 |
| 7,202,719 B2 * | 4/2007 | Gabato et al. | 327/158 |
| 7,254,729 B2 * | 8/2007 | Matsushima et al. | 713/322 |
| 7,256,600 B2 | 8/2007 | Walker et al. | |
| 7,262,623 B1 | 8/2007 | Mark et al. | |
| 2001/0024135 A1 | 9/2001 | Harrison | |
| 2001/0026183 A1 | 10/2001 | Kim | |
| 2001/0030553 A1 | 10/2001 | Aihara | |
| 2001/0035784 A1 | 11/2001 | Watarai | |
| 2002/0015460 A1 | 2/2002 | Bhullar et al. | |
| 2002/0027461 A1 * | 3/2002 | Kusunoki | 327/165 |
| 2002/0036526 A1 | 3/2002 | Nakamura | |
| 2002/0041196 A1 | 4/2002 | Demone et al. | |
| 2002/0057624 A1 * | 5/2002 | Manning | 365/233 |
| 2002/0153914 A1 | 10/2002 | Arabi et al. | |
| 2002/0154723 A1 | 10/2002 | Nakamura | |
| 2002/0157031 A1 | 10/2002 | Lin | |
| 2003/0001638 A1 | 1/2003 | Watarai | |
| 2003/0005374 A1 | 1/2003 | Fought et al. | |
| 2003/0030461 A1 | 2/2003 | Oberle et al. | |
| 2003/0067333 A1 | 4/2003 | Nakamura | |
| 2003/0071606 A1 | 4/2003 | Sunter | |
| 2003/0099321 A1 * | 5/2003 | Juan et al. | 375/376 |
| 2003/0151433 A1 | 8/2003 | Takai | |
| 2003/0196153 A1 | 10/2003 | Evans | |
| 2003/0199262 A1 | 10/2003 | Chung | |
| 2003/0208708 A1 | 11/2003 | Sunter | |
| 2004/0027993 A1 | 2/2004 | Ghiasi et al. | |
| 2004/0051551 A1 | 3/2004 | Sunter | |
| 2004/0062121 A1 | 4/2004 | Chung et al. | |
| 2004/0098648 A1 | 5/2004 | Sunter | |
| 2004/0109464 A1 | 6/2004 | Seo et al. | |
| 2004/0119455 A1 | 6/2004 | Sunter | |
| 2004/0123197 A1 | 6/2004 | Sunter | |
| 2004/0153931 A1 | 8/2004 | Cao et al. | |
| 2004/0179640 A1 | 9/2004 | Jacob et al. | |
| 2004/0186675 A1 | 9/2004 | Larson et al. | |
| 2004/0196064 A1 | 10/2004 | Garlepp et al. | |
| 2004/0221197 A1 | 11/2004 | Goyal et al. | |
| 2004/0223571 A1 | 11/2004 | Donnelly et al. | |
| 2004/0246017 A1 | 12/2004 | Arabi et al. | |
| 2005/0007157 A1 | 1/2005 | Harrison | |
| 2005/0025190 A1 | 2/2005 | Frisch | |
| 2006/0132164 A1 | 6/2006 | Walker et al. | |
| 2006/0132165 A1 | 6/2006 | Walker et al. | |
| 2006/0279310 A1 | 12/2006 | Walker et al. | |

OTHER PUBLICATIONS

Arkin, Brian, "Realizing a Production ATE Custom Processor and Timing IC Containing 400 Independent Low-Power and High-Linearity Timing Verniers," IEEE International Solid-State Circuits Conference, Feb. 2004.

Bonnett, David, "IEEE 1149.1 yields new standards," Test & Measurement World, http://www.reed-electronics.com/tmworld/article/CA202501.html, Apr. 2002.

Christiansen, Jorgen, "An Integrated High Resolution CMOS Timing Generator Based on an Array of Delay Locked Loops," IEEE Journal of Solid State Circuits, Jul. 1996, pp. 952-957, 31:7.

Gillis, Pamela, et al, "Delay Test of Chip I/Os Using LSSD Boundary Scan," IEEE International Test Conference, Aug. 1998, pp. 83-90, Paper 4.1.

Hwang, Chorng-Sii, et al, "A High-Precision Time-to-Digital Converter Using a Two-Level Conversion Scheme," IEEE Transactions on Nuclear Science, Aug. 2004, pp. 1349-1352, 51:4.

Kuo, Andy, et al, "Jitter Models and Measurement Methods for High-Speed Serial Interconnects," ITC International Test Conference, Feb. 2004, pp. 1295-1302, Paper 46.1.

Kuo, Andy, et al, "Crosstalk Bounded Uncorrelated Jitter (BUJ) for High-Speed Interconnects," IEEE Transactions on Instrumentation and Measurement, Oct. 2005, pp. 1800-1810, 54:5.

Mantyniemi, Antti, et al, "A High Resolution Digital CMOS Time-to-Digital Converter Based on Nested Delay Locked Loops," IEEE, 1999, pp. 537-540.

Nelson, Rick, "PCB test: nails or TAP?" http://www.reed-electronics.com/tmworld/article/CA239852.html, Sep. 2002.

Ou, Nelson, et al, "Jitter Models for Design and Test of Gbps-Speed Serial Interconnects," IEEE Design & Test of Computers, IEEE Design & Test of Computers, Jul.-Aug. 2004, pp. 302-313.

Santos, Dinis M, et al, "A CMOS Delay Locked Loop and Sub-Nanosecond Time-to-Digital Converter Chip," 1996, pp. 289-291.

Sunter, Stephen K, et al, "Complete, Contactless I/O Testing—Reaching the Boundary in Minimizing Digital IC Testing Cost," ITC International Test Conference, Apr. 2002, pp. 446-455, Paper 16.2.

Tabatabaei, Sassan, et al, "Embedded Timing Analysis: A SoC Infrastructure," IEEE Design & Test of Computers, May-Jun. 2002, pp. 24-36.

Tabatabaei, Sassan, et al, "An Embedded Core for Sub-Picosecond Timing Measurements," ITC International Test Conference, Apr. 2002, pp. 129-137, Paper 5.3.

Tabatabaei, Sassan, et al, "Jitter Generation and Measurement for Test of Multi-Gbps Serial IO," ITC International Test Conference, Feb. 2004, pp. 1313-1321, Paper 46.3.

"Boundary-Scan Tutorial," Corelis, http://www.corelis.com/products/Boundary-Scan_Tutorial.htm.

"IEEE Standard Test Access Port and Boundary-Scan Architecture," The Institute of Electrical and Electronics Engineering, Inc., 2001, pp. i-iv and 1-200.

"IEEE Standard for a Mixed-Signal Test Bus," Test Technology Technical Committee of IEEE Computer Society, IEEE std 1149.4, pp. i-vi and 1-78, Approved Jun. 26, 1999.

"Standard Testability Method for Embedded Core-Based Integrated Circuits," (Draft), Test Technology Technical Committee of IEEE Computer Society, Standard IEEE 1500/D11, pp. i-vii and 1-131, Jan. 2005.

Non-Final Office Action for U.S. Appl. No. 11/520,200 mailed Apr. 2, 2009, 7 pages.

Non-Final Office Action for U.S. Appl. No. 11/520,344 mailed Nov. 20, 2008, 9 pages.

Non-Final Office Action for U.S. Appl. No. 11/520,344 mailed May 15, 2009, 11 pages.

Non-Final Office Action for U.S. Appl. No. 11/520,276 mailed Apr. 15, 2009, 8 pages.

Non-Final Office Action for U.S. Appl. No. 11/520,480 mailed Oct. 31, 2008, 8 pages.

Non-Final Office Action for U.S. Appl. No. 11/520,282 mailed Oct. 30, 2008, 8 pages.

Final Office Action for U.S. Appl. No. 11/520,282 mailed Apr. 16, 2009, 9 pages.

Non-Final Office Action for U.S. Appl. No. 11/520,530 mailed Nov. 24, 2008, 10 pages.

Non-Final Office Action for U.S. Appl. No. 11/520,530 mailed Apr. 30, 2009, 9 pages.

Non-Final Office Action for U.S. Appl. No. 11/510,035 mailed Oct. 24, 2008, 17 pages.

Peng, Tina, "Fed Circ. Sets Product-By-Process Patent Restrictions", www.Law360.com, published by Portfolio Media Inc. May 19, 2009, 3 pages.

Wikipedia, the free encyclopedia, "Electronic design automation", Internet article, http://en.wikipedia.org/wiki/Electronic_design_automation, May 21, 2009, 11 pages.

Non-Final Office Action for U.S. Appl. No. 11/510,035 mailed Nov. 14, 2007, 22 pages.

Non-Final Office Action for U.S. Appl. No. 11/510,035 mailed Jul. 2, 2008, 26 pages.

Non-Final Office Action for U.S. Appl. No. 11/520,423 mailed May 1, 2008, 10 pages.

* cited by examiner

PROGRAMMABLE STROBE AND CLOCK GENERATOR

RELATED APPLICATIONS

This application claims priority to U.S. Provisional Patent Application No. 60/716,386, entitled VARIOUS METHODS AND APPARATUSES FOR INPUT-OUTPUT DESIGNS, inventor Sassan Tabatabaei, filed Sep. 12, 2005.

TECHNICAL FIELD

Embodiments on the invention described herein relate generally to electronic signal generation. Embodiments on the invention more particularly relates to generation of stimuli for timing test and measurement applications.

BACKGROUND

Sequential delay test techniques are widely used for test and measurement involving timing parameters and stimuli. A technique is to launch a transition, (step, edge and/or pulse) at the input of a circuit and subsequently capture particular output(s) at a known time after the launch. A number of such tests may be combined to characterize a circuit's step response. Delays between launch and corresponding capture events are preferably programmable with a desired measurement resolution. For example, for basic I/Os (input-output circuits), it may typically be desirable to generate strobes whose relative delay can be programmed from roughly 0 to 10 ns (nanoseconds) with resolution of 100 ps (picoseconds) or better.

Some methods for programmable delay strobe generation may use excessively large numbers of delay circuit elements, or delay control taps to achieve sufficient performance. Also, in some implementations, an excessively high degree of device matching and/or calibration may be desirable.

Usage of DLL (delay-locked loop) circuits in digital signal generators may provide superior noise immunity, stability and relaxed settling performance. On the other hand, DLLs may require good tolerance delay elements that are not cheap in terms of semiconductor real-estate or manufacturing costs. Where timing tests, such as I/O timing tests are to be performed on a device in embedded mode (using mostly self-generated signals). It is particularly important that the circuitry provide good performance without large real estate requirements such as may arise out of excessive circuit complexity.

SUMMARY

Embodiments of the invention may provide circuits with at least two DLLs having differing numbers of delay elements thereby producing many timing signals having various phase relationships. In a preferred embodiment two DLLs run at the same frequency being locked to a common reference clock. Downstream circuitry can generate many different timing intervals as may be defined by independently selected events such as edges in signals separately arising from each of the DLLs.

In one embodiment the numbers of delay elements in the two DLLs may be co-prime and the number of steps of resolution provided can greatly exceed the total number of delay elements in the circuit.

In an embodiment timing test circuits may be provided.

In an embodiment, methods for generating timing signals may be provided.

DETAILED DESCRIPTION

Embodiments of the present invention may provide strobe generation methods and circuits having a superior price/performance than other solutions. Moreover it may be possible to achieve embodiments of superior performance using fewer circuit components and/or less critical component tolerances thus improving reliability, yield and/or providing still further advantages.

Embodiments of the present invention particularly may use DLL (delay-locked loop) circuits and may be especially advantageous for embedded applications, such as for I/O circuit AC (alternating current) timing test and debug.

Figure 1:
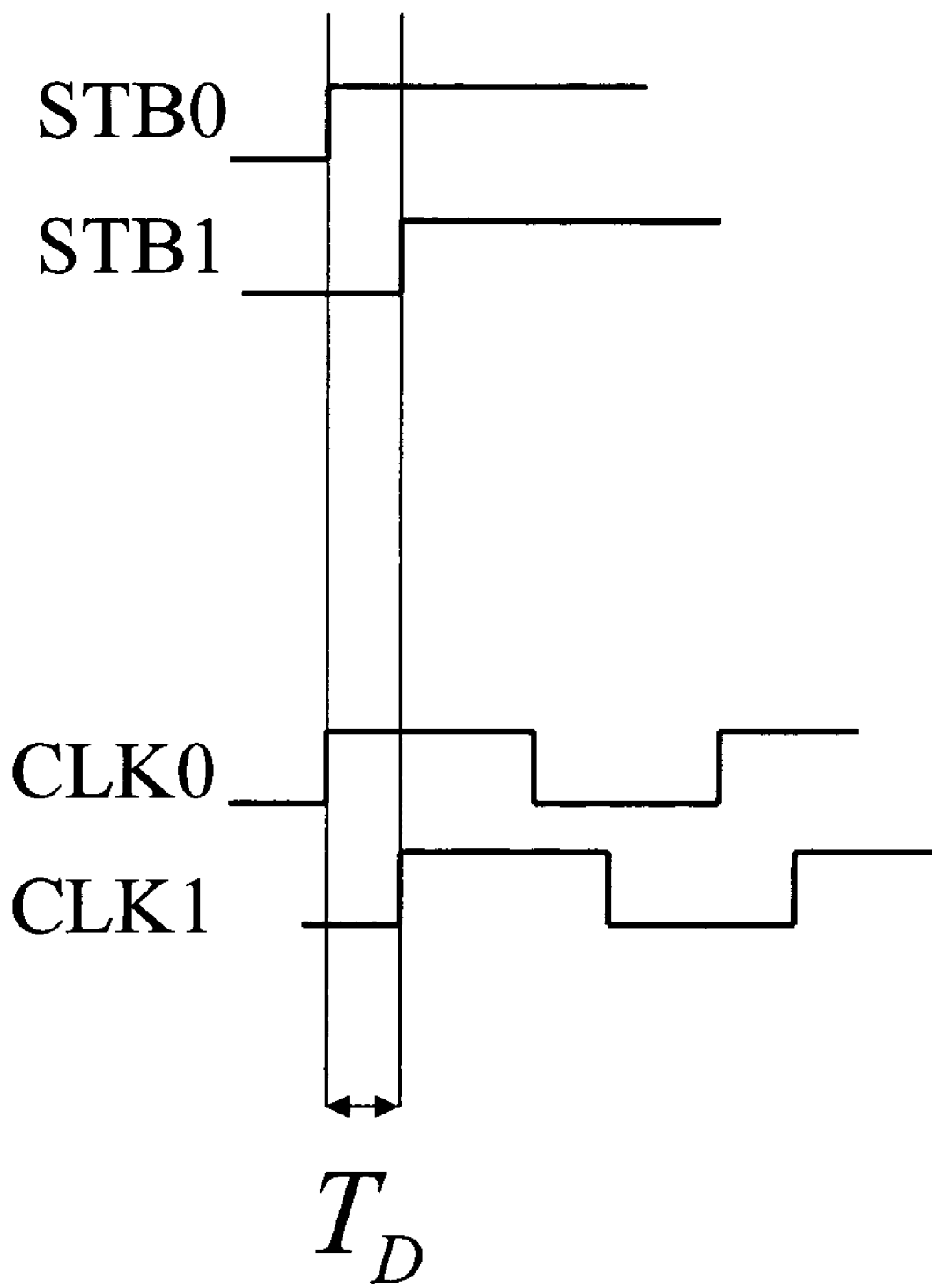
FIG. 1 shows a representation of timing signals.

FIG. 1. An I/O timing test may require two signals ("launch" and "capture") with a programmable time delay $T_D$ between the two that is both accurate and precise. FIG. 1 shows two forms of such timing signals; these may be Strobes (STB0 and STB1) and/or Clocks (CLK0 and CLK1). It is important to be able to set the time delay accurately and with good precision, and resolution (hence in small steps assuming a digital approach). It may be challenging to provide many steps at reasonable cost without trading off accuracy, reliability etc. and with the use of only a relatively few circuit elements, especially delay elements. Such I/O timing test delays may typically, but not necessarily, be very roughly on the order of a few nanoseconds to tens of milliseconds.

Figure 2:
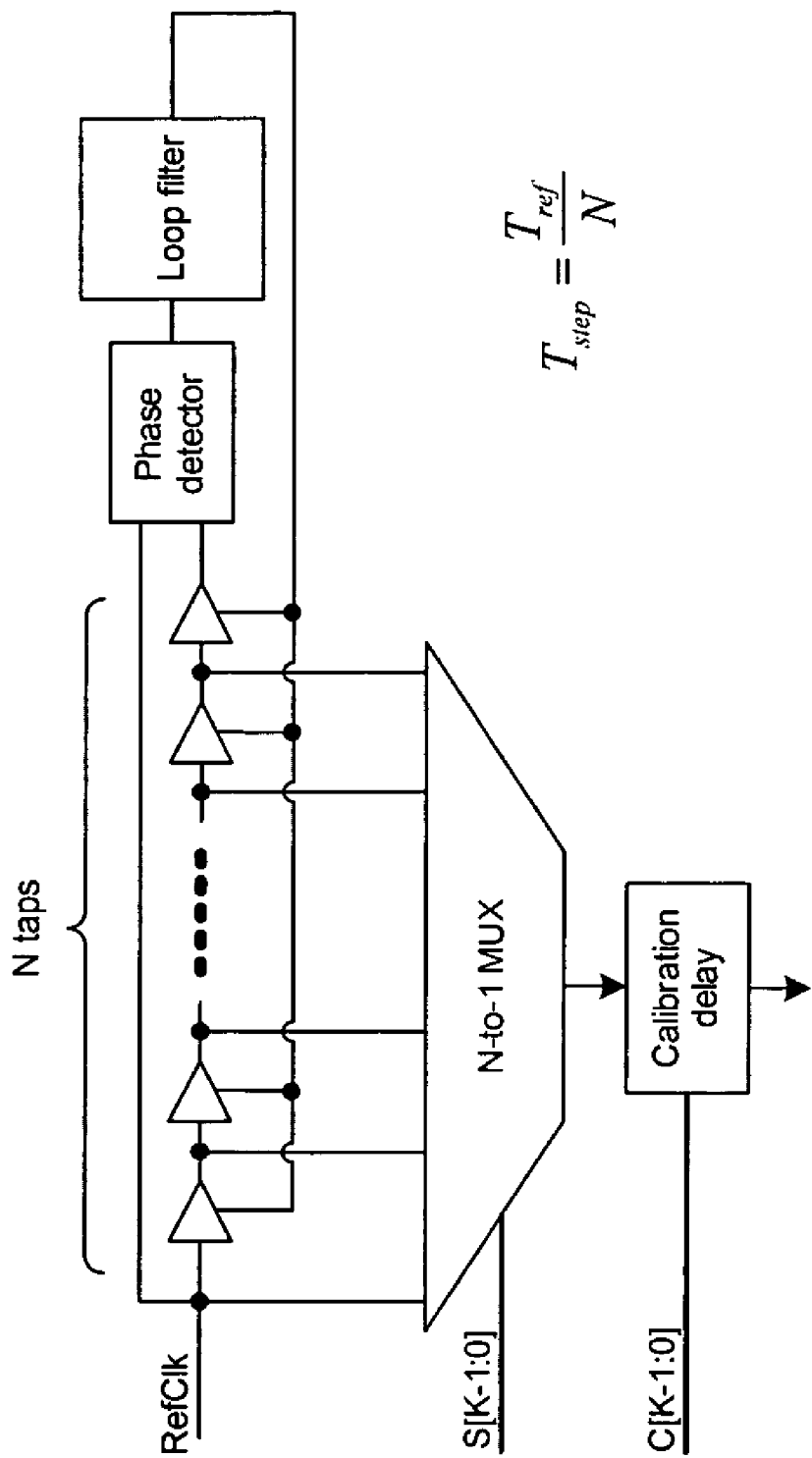
FIG. 2 shows part of a DLL based signal generator circuit.

FIG. 2 shows, in block diagram form, a circuit fragment of a DLL based generator. Inspection of that circuit reveals that the number of available steps of precision is equal to the number N of voltage controlled delay elements. The precision is proportional to the inverse of the step time Tstep. This can severely limit precision since a large number of elements would be too expensive and also would need to be carefully matched which might add further to the difficulty and expense.

Figure 3:
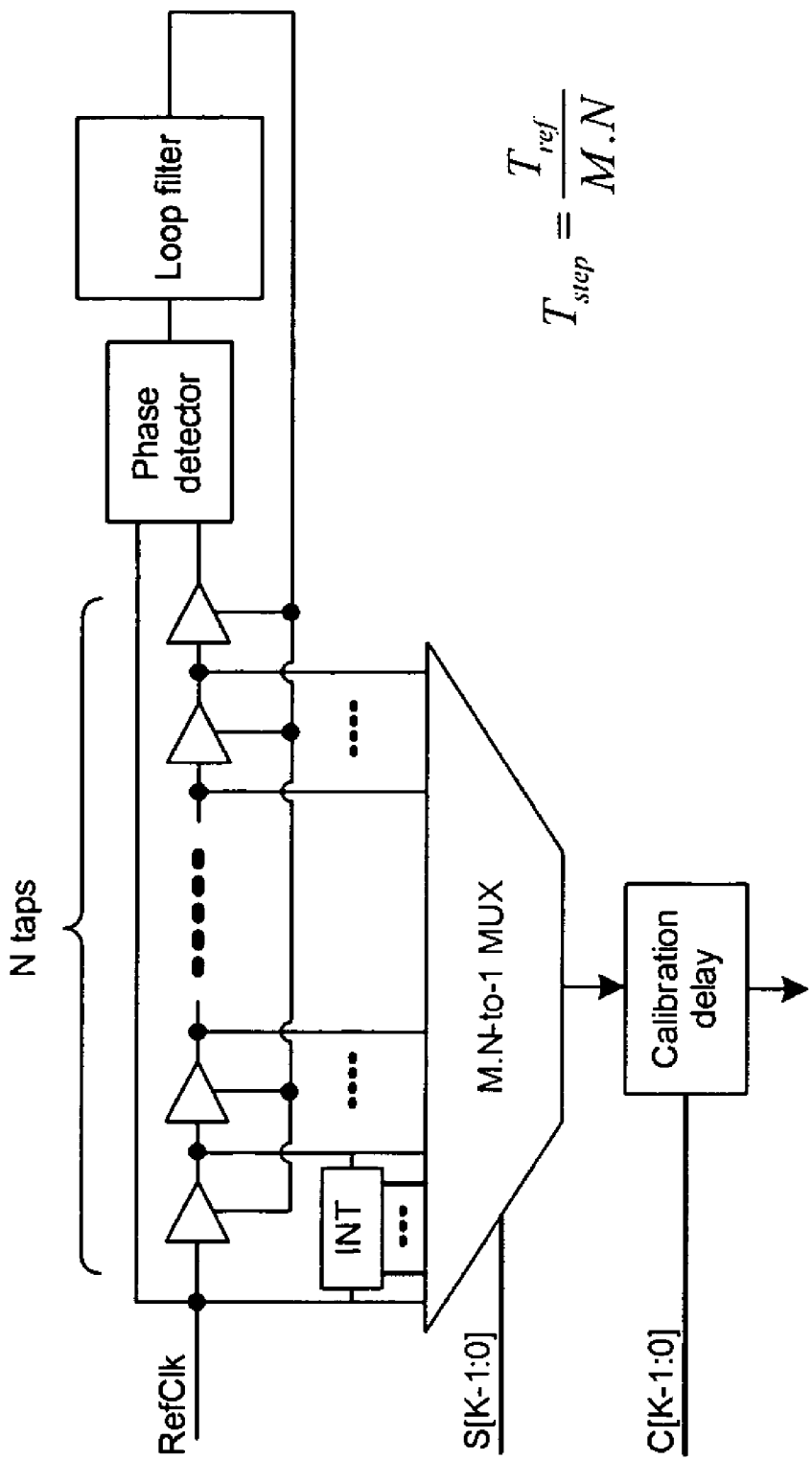
FIG. 3 shows part of an alternative DLL based signal generator circuit.

FIG. 3 shows, in block diagram form, an alternative DLL based generator circuit fragment. As contrasted with FIG. 2, this circuit has additional interpolator circuits INT added (only one is shown in FIG. 3). The interpolators in this case expand from 1 step per delay circuit to M steps per (voltage controlled) delay element. This design shows some improvement over that of FIG. 1; in particular the interpolators may be less complex and may have less critical component values than the delay elements. However if the number of steps M times N is large then the multiplexer (MUX) may become very large. And since the MUX is in a critical timing path it can be disadvantageously expensive to make it sufficiently well matched across all the signal paths.

Figure 4:
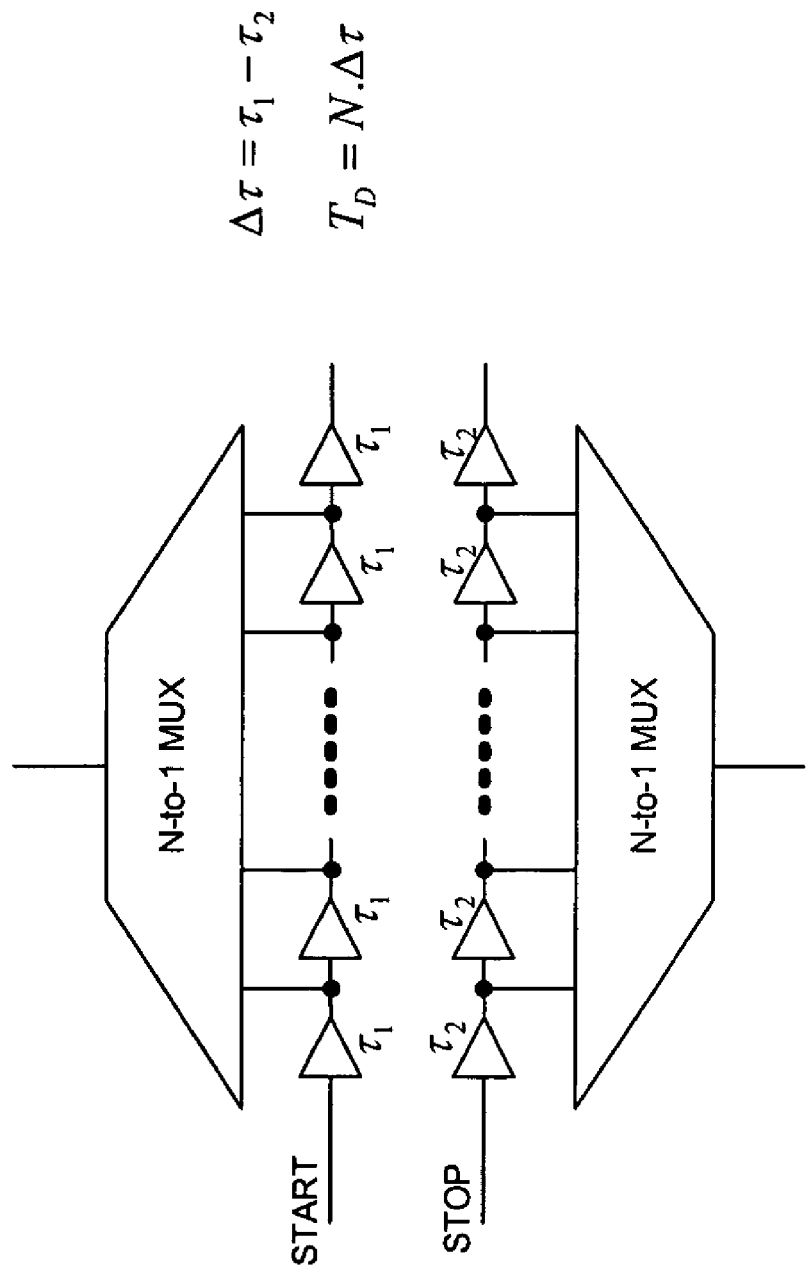
FIG. 4 shows part of another alternative delay-line based signal generator circuit.

FIG. 4 shows another alternative delay-line based generator circuit. As contrasted with the circuits of FIGS. 2 and 3, this circuit provides for separate "START" and "STOP" signals. Thus it can generate a very small time interval without necessarily having short signal paths throughout. As indicated in FIG. 4, it is the time delta $T_D$ that may be critical and provided the two halves of the circuit are well balanced then very small intervals may be achieved. However FIG. 4 still provides for a resolution that is proportional to the number of delay elements and hence expensive if a desirable high precision is specified over a wide delay range.

Figure 5:
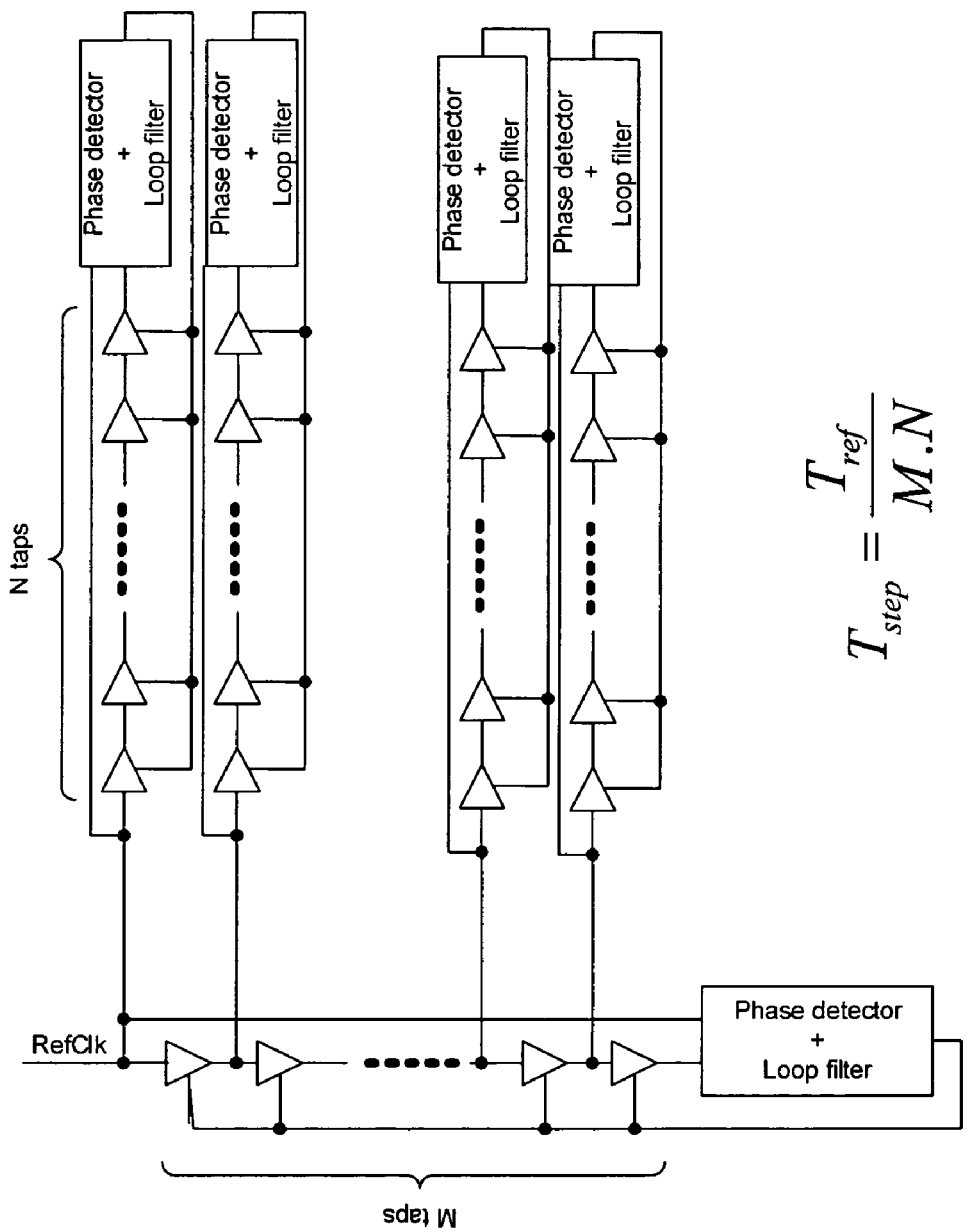
FIG. 5 shows part of double delay line based signal generator circuit.

FIG. 5 shows part of still another DLL based generator circuit. This implementation is rather similar to that of FIG. 3, but instead of interpolator circuits an array of second-tier DLLs is used. Though capable of good resolution and superior accuracy this implementation is likely to be expensive in terms of real estate and matching needs. The circuit of FIG. 5 might not be economically feasible for DFT (Design for Test) and/or BIST (built-in self-test) circuit applications. This design may be economic only for discrete (off-chip) testing such as may be appropriate to implement in low volume applications such as in dedicated test equipment.

Figure 6:
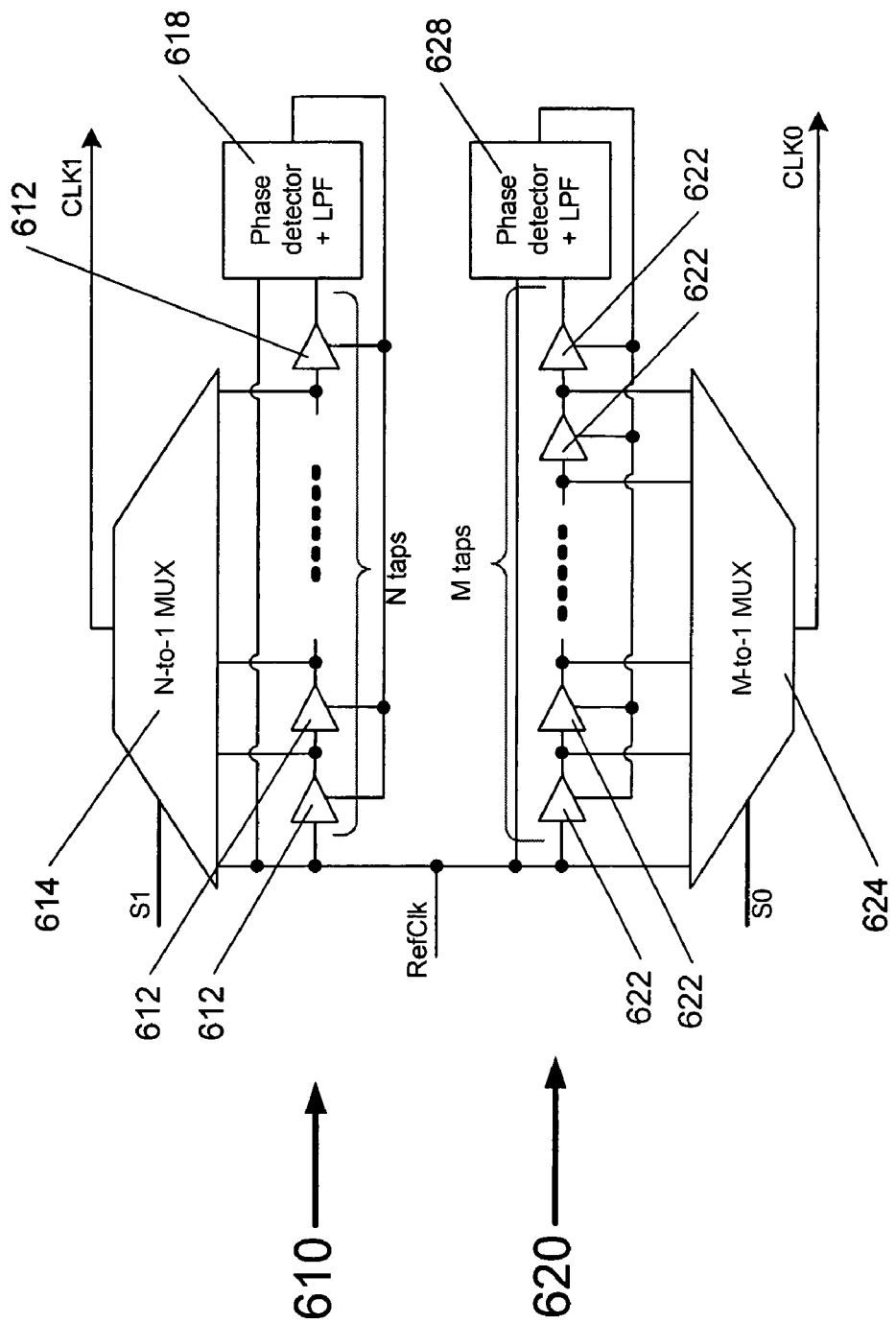
FIG. 6 shows part of a DLL based generator circuit according to an embodiment of the invention.

FIG. 6 shows, in partial block diagram form, part of a DLL based generator circuit 600 according to an embodiment of the invention. Two DLLs 610, 620 are provided including respective variable delay elements 612, 622 controlled by respective phase detectors with LPFs (low pass filters). 618, 628. The two DLLs 610, 620 are synchronized to a common reference input clock signal RefClk. The multiple outputs of the two DLLs 610, 620 are fed to respective selecting MUXes 614, 624 which select the appropriate clocks from the DLLs as dictated by selector signals S1, S0 so as to generate output clock signals CLK1, CLK0 which are each delay-locked to the input RefClk but with separately programmable (selectable) delays. In typical embodiments the number of delay elements N in the first DLL 610 is necessarily unequal to the number of delay elements M in the second DLL 620. Since the two DLLs are locked to the same RefClk, the delay through each delay element 612 is proportionally different from the delay through each delay element 622.

The circuit has intrinsic designed-in aspects of self-temperature compensation and common mode rejection of low frequency noise such as may typically be present in power rails. Although resultant noise immunity and compensation may be an advantage of embodiments of the invention, the superior price performance is also a major consideration.

Figure 7:
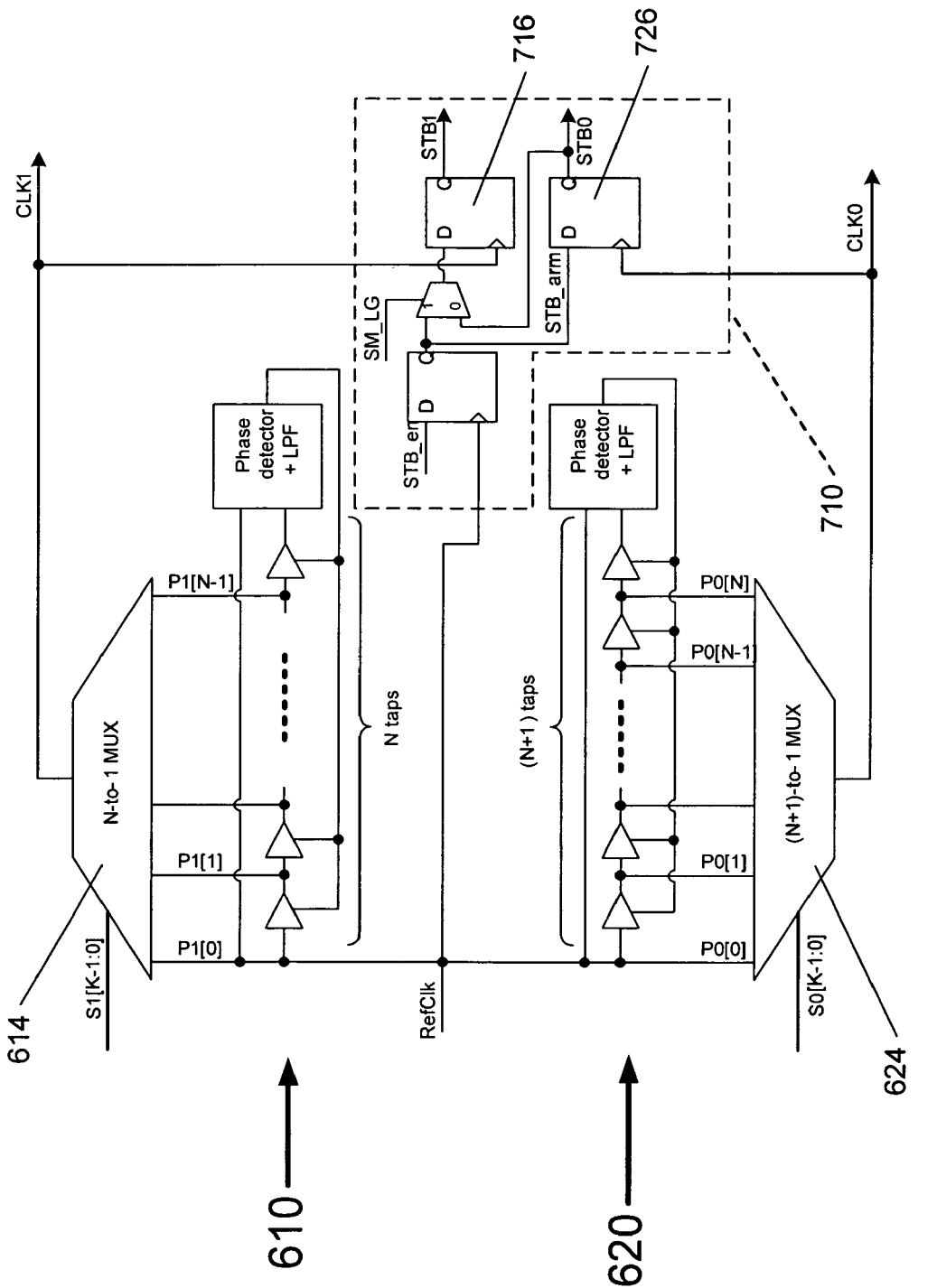
FIG. 7 shows another part of a generator circuit according to an embodiment of the invention.

FIG. 7 shows, in partial block diagram form, a strobe generator circuit according to an embodiment of the invention and such as may be based on the clock generator of FIG. 6. The circuit includes two DLLs 610, 620 and two MUXes 614, 624 together with a strobe conversion clock circuit 710.

Referring to FIG. 7, a low jitter reference clock, RefCLk, with period of $T_{ref}$ drives both DLLs 610, 620. The first DLL 610 has N delay elements and generates N equally spaced phases of the RefClk. The time delay between different phases of the first DLL outputs is therefore given as $T_{ref}/N$. Similarly, the second DLL 620 with (N+1) delay elements generates (N+1) uniformly spaced phases of the RefClk with $T_{ref}/(N+1)$ time delay between adjacent phases. MUX 614 selects one of the phases generated by the first DLL, and MUX 624 selects the phases of the second DLL.

The two DLLs 610, 620 are synchronized to a common reference clock signal RefCLk and have substantially parallel signal paths that converge together in the strobe conversion circuit 710. The two MUXes 614, 624 together with the strobe conversion circuit 710 make up a detector circuit that receives N inputs from DLL 610 and N+1 inputs from DLL 620.

By selecting one phase of first DLL and independently selecting one phase of the second DLL, it is possible to generate two clock signals with the same frequency as RefClk but phase difference of any multiple of $T_{step}=T_{ref}/(N(N+1))$. For example, the time difference ($\tau_{P0[1]\text{-}to\text{-}P1[1]}$) between the P1[1] phase of the first DLL and P0[1] of the second DLL is $T_{step}$. In general, the following relationship can be used to generate two clocks with a phase as follows:

$$\tau_{P0[(k)_{N+1}]\text{-}to\text{-}P1[(k+i)_N]} = i\left(\frac{T_{ref}}{N}\right) + k\left(\frac{T_{ref}}{N(N+1)}\right)$$

where $(X)_Y$ represents X modulus Y; and i and k are each integers. This phase delay is a multiple of $T_{step}$ and thus, with a resolution of $T_{step}$ any phase delay between 0 and $T_{ref}$ may readily be generated.

The strobe converter circuit 710 may use selected programmable phases of the two clocks, CLK1 and CLK0, to generate two strobe signals STB1, STB0. The delay between the two rising edges in the strobe signals is equal to the duration associated with the phase difference between CLK1 and CLK0.

The strobe converter circuit 710 may include various refinements. For example, the use of a SM_LG (small or large) signal is provided to cater for a situation which may arise when the desired time delay is small, in particular it may be less than the relevant flip-flop setup times. When the time delay is small, SM_LG may be set to assert a "SMALL" time condition, the STB_arm signal may then function to arm both strobe converter output flip-flops 716, 726. But when the desired time delay is larger than setup time of a flip-flop, SM_LG may be conversely set to assert a "LARGE" time condition and the STB0 signal may then function to arm the STB1 output flip-flop 716. This arming mechanism may ensure that STB1 edge is always generated at the intended delay after the respective STB0 transition.

In other embodiments of the circuit (not shown in FIG. 7) the addition of cycle delays using further flip-flops may easily be used to extend the range of delay control well beyond $T_{ref}$, while still maintaining the fine delay resolution capability of $T_{ref}/(N(N+1))$ In practice, actual embodiments of the invention can easily provide better than 50 ps resolution with a 100 MHz reference clock signal using two DLLs that have 14 and 15 delay elements.

Figure 8:
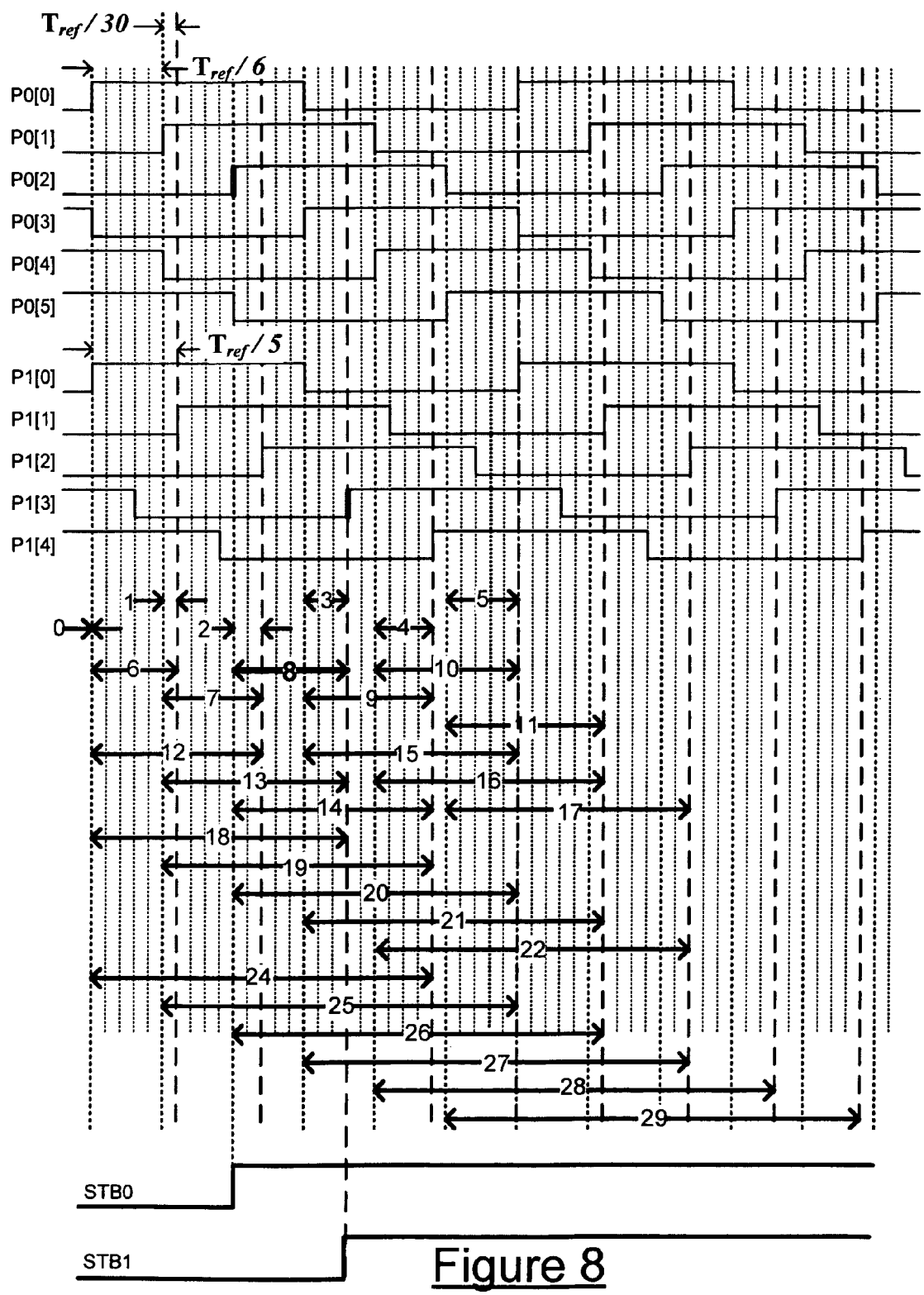
FIG. 8 shows a waveform diagram for one particular embodiment of the invention.

FIG. 8 shows a waveform diagram for an exemplary embodiment of the circuit of FIG. 7 in which a first DLL has 5 delay elements and a second DLL has 6 delay elements. This allows for the generation of 30 (5 times 6) different times between STB0 and STB1. These times are shown as number 0 through 29 in the lower part of FIG. 8. Thus, in the exemplary circuit 11 (i.e. 5+6) inputs from DLLs are used to achieve a temporal resolution of the period of RefClk/30 (i.e. RefClk/N·M). Or in a more general case (N+M) inputs from DLLs are used to achieve a temporal resolution of the period of RefClk/(N·M).

Still referring to FIG. 8, the six clock waveforms P0[0] through P0[5] represent the signals output from each of the six stages of DLL 620 as input to MUX 624. Similarly, the five clock waveforms P1[0] through P1[4] represent the signals output from each of the six stages of DLL 610 as input to MUX 614. In the example shown, STB0 has been generated by having MUX 624 select the rising edge of the P0[2] signal. Similarly STB1 has been generated by having MUX 614 select the rising edge of the P1[3] signal. As can be seen this results in an interval of 8 times the temporal step size $T_{step}$ of the circuit. As can be seen by inspection any of the 29 intervals of non-zero multiples of $T_{step}$ can be generated by the correct choice of signals selected by the MUXes (multiplexers.)

Figure 9:
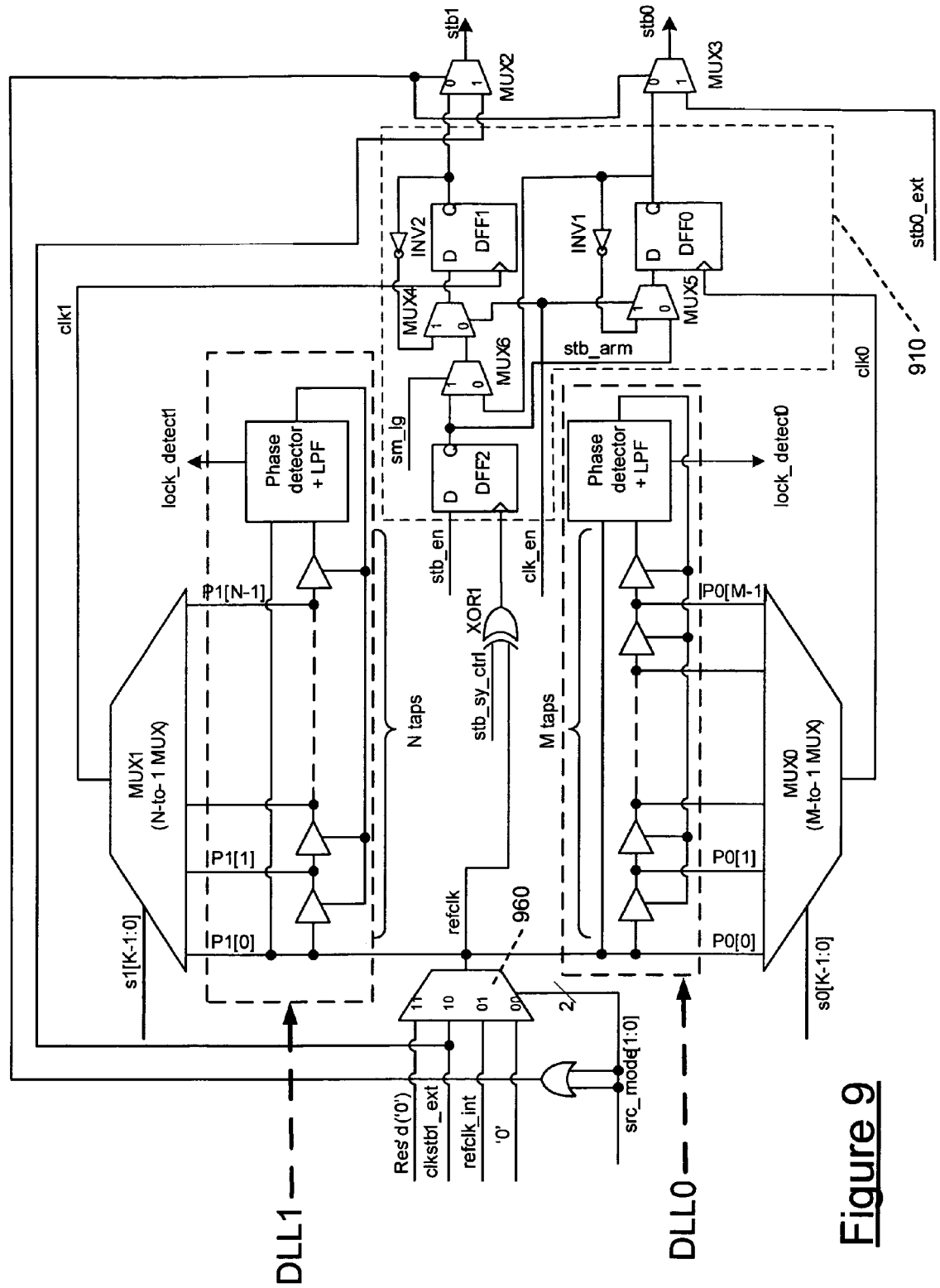
FIG. 9 shows a strobe generator circuit according to an embodiment of the invention.

FIG. 9 shows a more complete practical strobe generator circuit according to an embodiment of the invention. Though a number of refinements are present in the circuit of FIG. 9, there is nonetheless a similarity to the circuits described above.

The operation of circuit of FIG. 9 will now be described. This circuit includes two DLLs, referenced as DLL0 and DLL1. Each DLL contains one delay line (composed of multiple delay elements) whose delay is adjusted through the closed loop control. Once in lock state, the DLLs allow dynamic delay calibration as the closed loop ensures that delay of the delay line in each DLL is equal to one period of a reference clock (RefClk) regardless of temperature, process, and low frequency power supply voltage variations.

DLL0 and DLL1 have N and M delay elements respectively. Assuming that the delay elements in each DLL are matched well, the delays of the elements in DDL0 and DLL1 are $\tau_0 = T_{ref}/N$ and $\tau_1 = T_{ref}/M$, respectively. The taps in the DLLs provide delay increments relative to the RefClk edge, thus DDL0 has M increments available and DLL1 has N increments available, as below:—A $$DLL0: T_{D0}(m) = m\tau_0, m=0, \ldots, M-1 \quad \text{Equation 1}$$

$$DLL1: T_{D1}(n) = n\tau_1, n=0, \ldots, N-1 \quad \text{Equation 2}$$

Still referring to FIG. 9, two multiplexers, MUX0 and MUX1, are used to multiplex the taps in DLL0 and DLL1 to separate outputs clk0 and clk1, respectively. These MUXes effectively act as phase selectors. The outputs of the MUXes are clock signals with the same period as the RefClk, but with phase delays given as $\phi_0 = 2\pi(m\tau_0/T_{ref})$ and $\phi_1 = 2\pi(n\tau_1/T_{ref})$ respectively, where $T_{ref}$ is the average period of the reference clock.

If N and M are co-prime, (i.e., their only common divisor is 1), exhaustively selecting all permutations of taps in DLL0 and DLL1 produces N times M different phases $\phi_D$ and corresponding time delays $T_D$ between corresponding edges of clk0 and clk1 uniformly temporally spaced from 0 to $T_{ref}$, as follows:

$$\varphi_D(k) = 2\pi(k \cdot T_{step}/T_{ref}) \quad \text{Equation 3}$$
$$T_D(k) = k \cdot T_{step}$$
$$k = 0, \ldots, (N \cdot M) - 1, T_{step} = \frac{T_{ref}}{N \cdot M}$$

From Equation 3, the time delay steps can be normalized to, and expressed with the integer k. The value of k is selected by MUX0 and MUX1 select lines, s0 and s1.

The waveforms in FIG. 8 illustrate how fine resolution achieved for N=5 and M=6. In that figure, the P0[0] to P0[4], and P1[0] to P1[5] represent the DLL0 and DLL1 taps that can be selected by the MUX0 and MUX1 selector inputs. For example, the delay between P0[1] and P1[1] is $T_D(1) = T_{ref}/(N(N+1))$. The range arrows in FIG. 8 shows how $T_D(0)$ to $T_D(N \cdot M-1)$ are obtained by selecting appropriate edges through MUX0 and MUX1.

Returning now to FIG. 9, in general, the delay between stb0 and stb1 is related to the two digital numbers s0 and s1 that control the MUX0 and MUX1 select input. To obtain a desired delay corresponding to integer k=0, . . . , N·M−1, first the following equation should be solved to obtain p such that:

$$k = ((M-N)p)_{M \cdot N} \quad \text{Equation 4}$$

Where $(X)_Y$ represents the X modulus Y, and p is the smallest integer that satisfies above equation. The values of s0 and s1 are then obtained as below:

$$s0 = (p)_N$$

$$s1 = (p)_M \quad \text{Equation 5}$$

From Equation 4 and Equation 5, it is also possible to find k for any selection of s0 and s1. To do so, first the two equations in Equation 5 must be solved to obtain the smallest P that satisfy both equations. Then Equation 4 is used to obtain k.

In a special case where M=N+1, the following equation can be used to obtain s0 and s1 from k:

$$s0 = (k)_{N+1} \quad \text{Equation 6}$$

$$s1 = \left(s0 + \left\lceil \frac{k}{N+1} \right\rceil\right)_N \quad \text{Equation 7}$$

where [X] represents the integer part of X And k can be computed from s1 and s0 as below:

$$k = (s1-s0)_N(N+1)+s0, s0=0, \ldots, N \text{ and } s1=0, \ldots, N-1 \quad \text{Equation 8}$$

Referring again to FIG. 9, a number of further practical circuit refinements will be discussed. The output multiplexers MUX3 and MUX4 are provided to facilitate the use of external strobe signals clkstb1_ext and stb0_ext, thus bypassing the strobe generator as may be required for certain tests. This selection of external strobe is controlled by the clk_mode[1:0] signal as shown. Also, the input reference clock MUX 960 enables the use of external clock clkstb1_ext instead of the internal reference clock refclk_int. These features are especially useful for characterization purposes.

Two DFFs ("D-type" flip-flops) DFF0 and DFF1 are used to provide the additional features of a Clock output mode and a Strobe output mode as follows:—

Clock output mode. Clock output mode is operable when the signals clk_en=1 and stb_en=0. In this mode, the '1' inputs of MUX4 and MUX5 are selected, causing DFF0 and DFF1 to jointly act as a divide-by-two circuit. In this mode, the output of DFF1 has half the frequency of RefClk, but the phase difference will be set as in Equation 3 (above).

Strobe output mode. Strobe output mode is operable when clk_en=0 and stb_en=1. In this mode, the '0' inputs of MUX4 and MUX5 are selected and DFF0 and DFF1 are initially set to Low. When clk_en is Low, the outputs stb0 and stb1 will contain single rising transitions with a relative delay set as in Equation 3. For large values of delay, the sm_lg signal is set to 0, thus allowing the DFF0 output to set the input of DFF1. This assures that the stb1 transition follows that of stb0. For small values of delay, the clk1 edge may be too close in time to the transition at DDF1 input, thus violating DFF1 setup time and missing the desired transition edge at the DFF1 output. To avoid this problem, in these circumstances, the sm_lg signal may be set to 1 so as to ensure both DFF0 and DFF1 are armed at the same time, and therefore neither DFF0 nor DFF1 has its setup time violated.

Still referring to FIG. 9, DFF2 also acts to allow the strobe enabling trigger signal stb_en to be from a different clock domain (such as from off-chip) without material risk of metastability.

Certain other design considerations may be taken into account. Because embodiments may provide fine delay control using only a small circuit real estate matching requirements are significantly reduced as contrasted with other solutions. In typical exemplary embodiments, delay elements in the DLLs may have to be matched within a tolerance of around 0.5%. Whenever sufficiently good delay element matching is impractical (or not even possible), additional calibration circuitry may be required.

Preferred strobe generator designs may conform to the following guidelines and recommendations:

As to the DLLs: Noise and jitter reduction techniques should be employed in the design of DLLs. Such techniques may include on-chip power supply decoupling capacitors, guard rings for substrate noise reduction, and use of differential structures, especially for the delay elements.

If the low pass filters prove to be too bulky, the analog VCDLs (voltage controlled delay line elements) may be replaced with digitally-controlled delays to create DDLLs (digital DLLs). This may involve replacing an analog LPF with a digital controller, which is typically much smaller. Hybrid digital/analog LPFs are another feasible solution. LPF design trade-off is a complex matter.

The DLLs may generate lock indicators. These status flags may preferably be sampled by a controller to determine the readiness of the strobe generator circuit such as for self-test and operational readiness confirmation purposes.

As to the DDL phase MUXes: The two ('N-to-1' and 'M-to-1') MUXes should preferably be designed with symmetrical inputs such that the delays from each input to the output is substantially matched with the corresponding delays of other inputs selectable to the output. This may be achieved, for example, by using symmetrical input digital gates specifically designed for these MUX applications. The paths from the RefClk node to the inputs of the DLLs should preferably be matched. The paths from MUX1 output to DFF1 and from MUX0 output to DFF0 should preferably be matched also. MUX2 and MUX3 should preferably be matched to each other.

As to Overall matching: The overall mismatch tolerance from each clock phase in the two DLLs to the respective outputs of MUX2 and MUX3 should preferably be less than 25 ps over all corners in order to achieve an overall accuracy of 50 ps in the setting of delays between stb0 and stb1. Based on existing design and fabrication technologies, 25 ps matching may reasonably be expected to be achievable given the symmetry of the strobe generation circuit and the reliance on differencing delays rather than on absolute delay values. If sufficiently good overall matching proves to be difficult to obtain, additional calibration mechanism can be added to enhance the accuracy as is well known in the relevant arts. The decision as to whether to add calibration circuitry may be tactical driven by performance requirement specifications.

As to the Strobe/Clock selector: The stb1 transition normally follows that of stb0. However, in certain applications, stb1 edge may preferably precede that of stb0 so as to obtain negative stb0-to-stb1 delays. This may be achieved by activating sm_lg signal and by proper selection of the s0[k−1:0] and s1[k−1:0] signals used to control MUX0 and MUX1.

As to the sm_lg signal: Upon activation of stb_en signal, DFF0 and DFF1 each generate outputs with single transition that have the same relative delay as that of CLK0 to CLK1 phase delay. For large value of delay, DFF0 output drives DFF1 D-input without violating the DFF1 setup time. But, disadvantageously, for small values of delay, DFF1 D-input may not be armed early enough to generate any transition at its output until next cycle, or the generated delay may be significantly longer than expected due to DFF1 metastability.

To avoid such a problem, for small delays, (typically delays less than the setup time of the DFF1 plus the MUX4 and MUX5 delays and margin to account for Process Voltage and Temperature (PVT) variations), the D-input of both DFF0 and DFF1 may be armed simultaneously (by settings the sm_lg signal to HIGH). The circuit controller sets sm_lg depending on the target delay programmed by s0[k−1:0] and s1[k−1:0]. The sm_lg signal may also be asserted for negative delay because such delays may be expected to be small relative to the RefClk period.

In the Clock mode, DFF0 and DFF1 may be placed in a toggle mode by programming MUX4 and MUX5 to transmit the respective input from the inverters INV1 and INV2. This may cause the generation of two clock signals at the stb0 and stb1 outputs each having half the frequency of RefClk and having a phase delay set by the s1[k−1:0] and s0[k−1:0] signals. The Clock mode may, for example, be reserved for measuring jitter at the I/O such as by monitoring the BER (bit error rate) as the launch and capture edges are repeatedly programmed to be close to the I/O delay, for example in an iterative convergence procedure. This mode may be a characterization mode, which can provide various information— such as concerning power supply noise, adjacent I/O coupling noise, etc.

The flip-flop DFF2 and the XOR gate XOR1 may be used to synchronize the stb_en signal to the RefClk. This helps avoid metastability problems that may otherwise occur since the signals in the strobe generator are synchronized to RefClk, and while stb_en may be generated by a circuit having a different clock domain. For more complete protection against metastability, two or more DFFs can be cascaded. XOR1 may cause the synchronization to occur on either rising or falling edge of RefClk as may be selectively required.

Whenever one of MUX0 or MUX1 has an output that contains a transition close to the RefClk edge, metastability may occur within DFF0 and/or DFF1. To handle such cases, the controller may set the DFF2 triggering edge to the opposite polarity in order to ensure the stb_arm signal does not violate setup time of either DFF0 or DFF1. The control signal stb_sy_ctrl may be generated by a control circuit and may set the DFF2 trigger transition polarity.

External strobe/clock inputs: As to the External clock mode, this may be activated when src_mode=10. In this mode, a supplied external clock is used as reference clock. This may be especially useful for characterization purposes, for example cleaner clocks supplied externally may be used for improved measurement accuracy.

As to External strobes mode, this mode may be activated when src_mode=11. In this mode, the internal strobe generation circuit is completely bypassed. The clock input of the DLLs may advantageously be turned off so as to deactivate the DLLs thus reducing noise. This mode may be useful for direct and accurate control of strobes through precision off-chip equipment. It may also be useful for production testing whenever the tester being used is capable of generating sufficiently accurate time delays.

Figure 10:
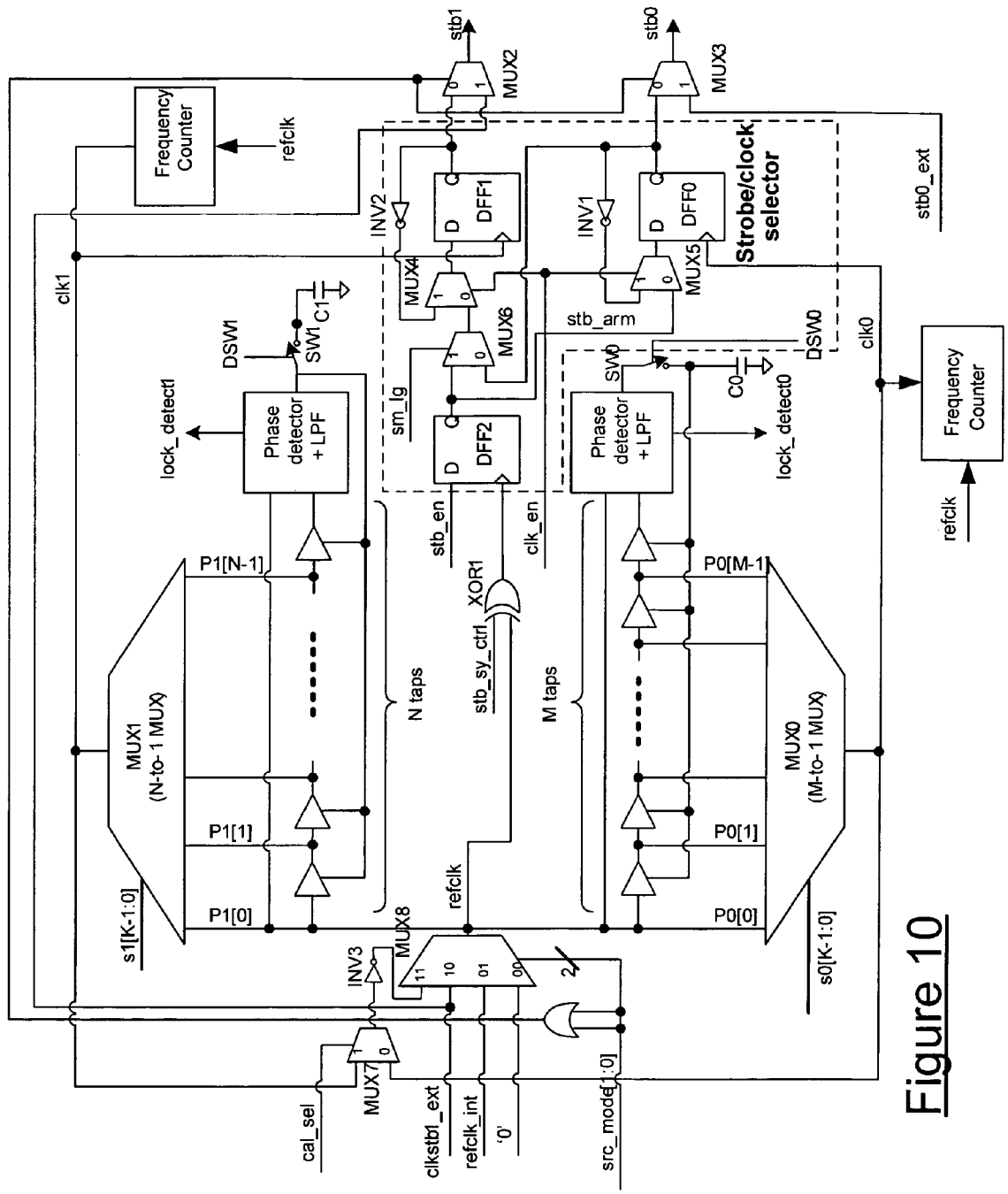
FIG. 10 shows circuitry for calibrating a strobe generator according to an embodiment of the invention.

FIG. 10 shows circuitry for calibrating a strobe generator according to an embodiment of the invention. The circuits described above include a measure of inherent dynamic calibration due to the DLL operational characteristics. However, reliance is made on the matching of delay elements within each DLL and of the MUX input-to-output matching so as to provide predictable strobe delays, which are preferably uniformly spaced in the range 0 to Tref. For very high resolution operation, such as wherein the strobe resolution may be in 10 ps range (or less), it may be preferred to calibrate the respective mismatches of delay elements in the DLL and also to calibrate the MUX path delays separately. The strobe generator circuit in FIG. 10 includes mismatch calibration circuit features.

A calibration procedure using the circuit of FIG. 10 will now be described: To calibrate multiple stages in one DLL, e.g., DLL0, first the switch SW0 is closed and the DLL is allowed to operate in the normal mode so as to acquire lock. Once the voltage at the output of the loop filter becomes stable, SW0 may be opened so as to store a delay control voltage on capacitor C0. The next step is to select the '11' input of the MUX8 and '0' input of MUX7. This provides a ring oscillator path that is comprised of the one of more delay elements in DLL0 and MUX0, the MUX7 plus MUX8 delay, and the inverter INV3 delay. The number of delay elements in the ring depends upon the MUX path selected by the s0[k−1:0] signal. The clk0 signal is applied to a frequency counter that counts the number of oscillations in a given number of RefClk periods in order to determine the delay through the total path as follows:

$$\tau(i) = \tau_{DL(i)} + \tau_{MUX0(i)} + \tau_{MUX7} + \tau_{MUX8} + \tau_{INV1} \text{ for } i=0, \ldots, M-1$$

$$\tau_{DL(i)} = \tau_{DE1} + \ldots + \tau_{DEi}$$

$$\tau_{MUX0(i)} = \tau_{MUX0\_in(i)\text{-}to\text{-}out} \quad \text{Equation 9}$$

The above procedure may be repeated for all valid values of s0 to obtain $\tau(i)$ for $i=0, \ldots, M-1$. The deviation of differences between delay estimate $\tau(i)$ and $\tau(i+1)$ from an exact multiple of $T_{step}$ indicates the mismatch in the delays and the MUX path. This estimate can be used to compensate for the mismatch error depending on the application requirements. For example, if the strobe generator is used for delay measurement, the measured delays may need to be adjusted for the possible error. The procedure above may also be applied to the DDL1 by selecting the '1' input in MUX7.

Figure 11:
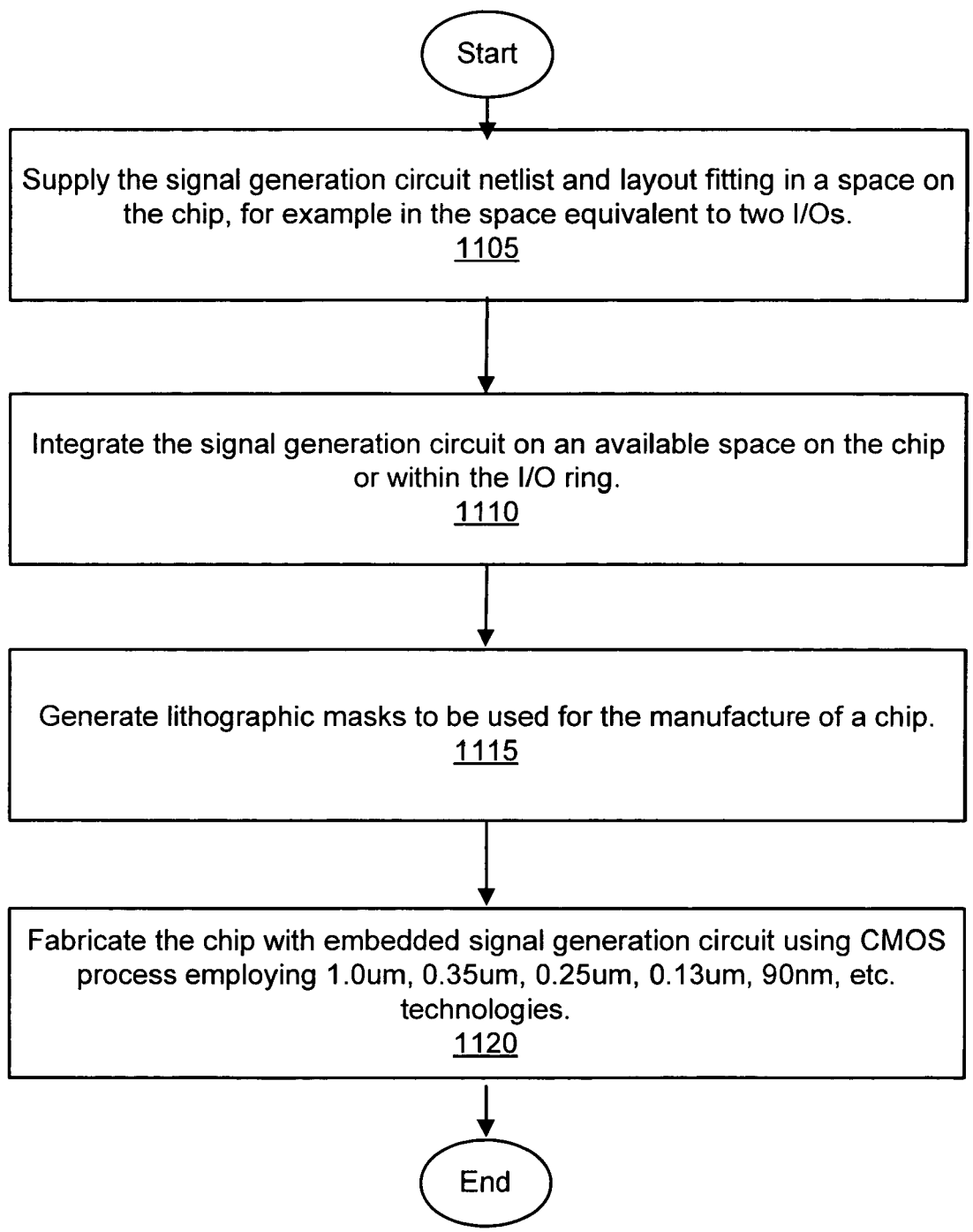
FIG. 11 illustrates an example of a process for generating a device according to an embodiment of the invention.

FIG. 11 illustrates an example of a process for generating a device with a test circuit from designs of timing components utilizing an electronic circuit design generator such as may form part of an Electronic Design Automation (EDA) toolset. The information representing the apparatuses and/or methods for the test circuit may be contained in an Instance, soft instructions in an electronic circuit design generator, or similar machine-readable storage medium storing this information. The information representing the apparatuses and/or methods stored on the machine-readable storage medium may be used in the process of creating the apparatuses and/or methods described herein.

The electronic circuit design generator may be used for making a highly configurable, scalable System On a Chip (SOC) inter-block communication system that integrally manages data, control, debug and test flows, as well as other applications. In an embodiment, an example electronic circuit design generator may comprise the following: a graphic user interface; a common set of processing elements; and a library of files containing design elements such as circuits, control logic, and cell arrays that define the electronic circuit design generator. The electronic circuit design generator may be used in designing a System on a Chip (SOC). Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

In block 1105, the designs for the signal generator circuit is supplied to the electronic circuit design generator, as well as other device design parameters such as number of delay elements and MUX sizes. Thus, the designs for a device such as a signal generator circuit may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment this may involve supplying the signal generation circuit netlist and layout fitting in a space on the chip, for example in the space equivalent to two I/Os An example electronic circuit design generator may comprise the following: a graphic user interface, a common set of processing elements, and a library of files containing design elements such as circuits, and control logic. In addition, the electronic circuit design generator may include object code in a set of executable software programs. The electronic circuit generator provides timing diagrams, power and area aspects of each component, a models coded to represent the components in order to run actual operation and configuration simulations. The electronic circuit design generator may generate a netlist and a layout targeted to fit in the space available on a target chip. Typically, the electronic circuit design generator will store the data representing the memory and test circuit on a machine-readable storage medium. The electronic circuit design generator then may provide the device layout (including the test circuit) to be used to generate one or more lithographic masks utilized in the fabrication of the device including the test circuit. The electronic circuit design generator may also provide a netlist for verification of the device and test circuit.

In block 1110, the generated device layout may be integrated with the rest of the layout for the chip and a machine may generate the lithographic masks that contain the information necessary for the fabrication of a functional device. In an embodiment this may involve integrating the signal generation circuit on a available space on the chip or within the I/O ring.

In block 1115, the machine may generate one or more lithographic masks for transferring the circuit design onto the chip during manufacture.

In block 1120, a fabrication facility may fabricate one or more chips with the signal generation circuit utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the test circuit onto the chip itself. In one embodiment, the electronic circuit design generator is designed for embedded applications in a standard CMOS logic process.

Although a method embodiment has been described in reference to I/O timing test, it could be applied to other types of applications, such as precise timing generation for test instruments.

In one embodiment, an electronic circuit design generator may be implemented in software as a set of instructions stored on a machine-readable medium. A machine-readable storage medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

These embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than in a restrictive sense. For example, the design could readily be extended to advantageously utilize three or more DLLs.

As a further example, although circuits have been described above as operating through the utilization of signal edges to control sequencing etc in the circuitry as is conventional in the art, it would also be possible to utilize other types of signal events, such as pulses to control sequencing. Similarly, it might be possible to dispense with multiplexers such as by wholesale duplication of circuitry downstream of the DLLs.

Although preferred embodiments of the invention may use DLLs having an (N, N+1) relationship between the numbers of delay elements entirely functional embodiments of the invention may use other unequal numbers. For example, a pair of delay lines having 8 and 11 delay elements permits 88 steps of resolution, which is only marginally poorer than an optimum pair of 9 and 10 delay elements for a total of 90 steps. It will be noted that either embodiment (8+11 or 9+10) will use a total of 19 delay elements for a similar level of circuit cost and complexity. Also embodiments may be extended for further enhanced resolution, for example using interpolators. As a still further example, counters could be added to the circuit to create time intervals between launch and capture of many multiples of the periods of the reference clock.

What is claimed is:

1. A signal generation circuit, comprising:
    a first DLL (delay-locked loop) having a first set of delay elements operable to generate a first set of N timing signals;
    a second DLL (delay-locked loop) having a second set of delay elements operable to generate a second set of M timing signals;
    a detector circuit operable to create a set of output signals for defining an interval of time proportional to an elapsed time between a first event in a first signal selected from the first set of N timing signals and a second event in a second signal selected from the second set of M timing signals, wherein N and M are greater than 1 and N is unequal to M, and
    the set of output signals comprises a launch signal that starts a timed test sequence and a capture signal that ends a timed test sequence.

2. The signal generation circuit of claim 1 wherein, M and N are coprime and the phases of the first and second sets of timings signals are each respectively substantially mutually equally spaced in phase.

3. The signal generation circuit of claim 2 wherein, M equals N+1.

4. The signal generation circuit of claim 1 wherein,
    the first and second DLLs are synchronized to a common reference clock signal, and
    the detector circuit further comprises a first multiplexer coupled to receive N input signals from the first DLL and a second multiplexer couple to receive M input signals from the second DLL.

5. The signal generation circuit of claim 1 wherein, an input-output circuit of an integrated circuit device contains the timing test circuit.

6. The signal generation circuit of claim 1 wherein, the delay elements in the first DLL are matched in delay value relative to each other and the delay elements in the second DLL are matched in delay value relative to each other, however, the delay elements in the first DLL are unmatched in delay value relative to the delay elements in the second DLL.

7. A signal generation circuit, comprising:
a first DLL (delay-locked loop) having a first set of delay elements operable to generate a first set of N timing signals;
a second DLL (delay-locked loop) having a second set of delay elements operable to generate a second set of M timing signals;
a detector circuit operable to create a set of output signals for defining an interval of time proportional to an elapsed time between a first event in a first signal selected from the first set of N timing signals and a second event in a second signal selected from the second set of M timing signals, wherein N and M are greater than 1 and N is unequal to M, and
the set of output signals comprises a launch strobe and a capture strobe.

8. A signal generation circuit, comprising:
a first DLL (delay-locked loop) having a first set of delay elements operable to generate a first set of N timing signals;
a second DLL (delay-locked loop) having a second set of delay elements operable to generate a second set of M timing signals;
a detector circuit operable to create a set of output signals for defining an interval of time proportional to an elapsed time between a first event in a first signal selected from the first set of N timing signals and a second event in a second signal selected from the second set of M timing signals, wherein N and M are greater than 1 and N is unequal to M, and
the detector circuit further comprises a frequency divider and the output signals comprise at least one clock signal.

9. A signal generation circuit, comprising:
a first DLL (delay-locked loop) having a first set of delay elements operable to generate a first set of N timing signals;
a second DLL (delay-locked loop) having a second set of delay elements operable to generate a second set of M timing signals;
a detector circuit operable to create a set of output signals for defining an interval of time proportional to an elapsed time between a first event in a first signal selected from the first set of N timing signals and a second event in a second signal selected from the second set of M timing signals; where the first and second DLLs are synchronized to a common reference clock signal the detector circuit further comprises a first multiplexer coupled to receive N input signals from the first DLL and a second multiplexer couple to receive M input signals from the second DLL, wherein N and M are greater than 1 and N is unequal to M, and
the signal generation circuit is programmable to create output signals with a temporal resolution equal to a period of the common reference clock signal divided by a product of N times M.

10. An apparatus, comprising:
a signal generation circuit having
a first DLL (delay-locked loop) of N stages;
a second DLL of M stages wherein M is unequal to N and further wherein the first and second DLLs mutually have substantially parallel signal paths that generate timing signals that are mutually synchronizable;
a converter circuit coupled to receive at least N signals from the first DLL and further coupled to receive at least M signals from the second DLL,
wherein the converter circuit is operable to generate at least one output signal defining a time interval with a temporal resolution having a number of interval steps equal to or greater than a product of N times M divided by a highest common factor of N and M, wherein a number of stages in the first DLL is prime relative to a number of stages in the second DLL and N and M are each integers greater than 1.

11. The apparatus of claim 10, wherein, M equals N+1.

12. The apparatus of claim 10, wherein the apparatus comprises precisely two DLLs.

13. The apparatus of claim 10, wherein the at least one output signal comprises an output clock signal.

14. An apparatus, comprising:
a signal generation circuit having
a first DLL (delay-locked loop) of N stages;
a second DLL of M stages wherein M is unequal to N and further wherein the first and second DLLs mutually have substantially parallel signal paths that generate timing signals that are mutually synchronizable;
a converter circuit coupled to receive at least N signals from the first DLL and further coupled to receive at least M signals from the second DLL,
wherein the converter circuit is operable to generate at least one output signal defining a time interval with a temporal resolution having a number of interval steps equal to or greater than a product of N times M divided by a highest common factor of N and M, wherein the converter circuit generates the at least one output signal responsive to a next occurrence of a transition in a first signal of the M signals commencing after an occurrence of a particular transition in a first signal of the N signals and N and M are each integers greater than 1.

15. An apparatus, comprising:
a signal generation circuit having
a first DLL (delay-locked loop) of N stages;
a second DLL of M stages wherein M is unequal to N and further wherein the first and second DLLs mutually have substantially parallel signal paths that generate timing signals that are mutually synchronizable;
a converter circuit coupled to receive at least N signals from the first DLL and further coupled to receive at least M signals from the second DLL,
wherein the converter circuit is operable to generate at least one output signal defining a time interval with a temporal resolution having a number of interval steps equal to or greater than a product of N times M divided by a highest common factor of N and M, wherein the at least one output signal comprises a launch signal that starts a timed test sequence and a capture signal that ends a timed test sequence and N and M are each integers greater than 1.

16. An apparatus, comprising:
a signal generation circuit having
a first DLL (delay-locked loop) of N stages;
a second DLL of M stages wherein M is unequal to N and further wherein the first and second DLLs mutually have substantially parallel signal paths that generate timing signals that are mutually synchronizable;
a converter circuit coupled to receive at least N signals from the first DLL and further coupled to receive at least M signals from the second DLL,
wherein the converter circuit is operable to generate at least one output signal defining a time interval with a temporal resolution having a number of interval steps equal to or greater than a product of N times M divided by a highest common factor of N and M, and a flip-flop operable to receive a control signal indicating whether a duration exceeds a threshold, the flip-flop operable to control gating of the at least one output signal.

17. A method of generating signals comprising the acts of:

selecting a first periodic signal having a first phase angle from a set of N substantially equally spaced phases of a signal at a reference frequency;

selecting a second periodic signal having a second phase angle from a set of M substantially equally spaced phases of a signal at the reference frequency;

generating a first output signal responsive to an event in the first periodic signal; and responsive to the event in the first periodic signal, arming a circuit to generate a second output signal responsive to an event in the second periodic signal, wherein the events are transitions in the respective first and second periodic signals, and N and M are greater than 2, and N is unequal to M.

18. The method of claim 17, wherein M and N having a highest common factor of one.

19. The method of claim 17, wherein M equals N+1.

20. A method of calibrating a signal generation circuit that includes a first DLL comprising a first set of delay elements a second DLL, and a detector circuit, the method comprising:

operating the first DLL in a normal mode to acquire a first lock wherein the first DLL has an output first delay control voltage;

storing the first delay control voltage in a first capacitor as a first stored control voltage;

operating a first subset of the first set of delay elements as a first ring oscillator while simultaneously applying the first stored control voltage to the first subset of the first set of delay elements; and measuring an operating frequency of the first ring oscillator with the detector circuit.

21. The method of claim 20, further comprising:

operating a second subset of delay elements comprised within the second DLL as a second ring oscillator wherein the second subset of delay elements are controlled by a second stored control voltage from a second capacitor.

\* \* \* \* \*

UNITED STATES PATENT AND TRADEMARK OFFICE
CERTIFICATE OF CORRECTION

PATENT NO. : 7,616,036 B1 Page 1 of 1
APPLICATION NO. : 11/340147
DATED : November 10, 2009
INVENTOR(S) : Sassan Tabatabaei It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 335 days.

Signed and Sealed this

Nineteenth Day of October, 2010

David J. Kappos
*Director of the United States Patent and Trademark Office*